United States Patent
Gibson

(10) Patent No.: US 7,170,842 B2
(45) Date of Patent: Jan. 30, 2007

(54) METHODS FOR CONDUCTING CURRENT BETWEEN A SCANNED-PROBE AND STORAGE MEDIUM

(75) Inventor: Gary A. Gibson, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1077 days.

(21) Appl. No.: 09/783,008

(22) Filed: Feb. 15, 2001

(65) Prior Publication Data

US 2002/0110074 A1    Aug. 15, 2002

(51) Int. Cl.
*G11B 9/10*    (2006.01)

(52) U.S. Cl. ............... 369/101; 369/13.14; 369/126; 250/306; 250/307

(58) Field of Classification Search ............ 369/126, 369/101, 47.1, 13.14, 13.13; 250/307, 216, 250/306, 459.1, 458.1; 216/41, 4, 39; 73/105; 359/368; 356/614; 360/114.01; 365/10; 346/4.2; 204/600
See application file for complete search history.

(56) References Cited

U.S. PATENT DOCUMENTS

| | | | |
|---|---|---|---|
| 3,978,492 A | 8/1976 | Simm | |
| 4,242,433 A | 12/1980 | Kuehnle et al. | |
| 4,382,186 A | 5/1983 | Denholm | |
| 4,427,886 A | 1/1984 | Martin et al. | 250/310 |
| 4,497,007 A * | 1/1985 | Greiner et al. | 360/114.01 |
| 4,534,016 A | 8/1985 | Kirkpatrick | 365/128 |
| 4,600,839 A | 7/1986 | Ichihashi et al. | 250/310 |
| 4,760,567 A | 7/1988 | Crewe et al. | 369/101 |
| 5,062,364 A | 11/1991 | Lewis et al. | |
| 5,216,631 A | 6/1993 | Sliwa, Jr. | 365/174 |
| 5,283,437 A * | 2/1994 | Greschner et al. | 250/306 |
| 5,307,311 A | 4/1994 | Sliwa, Jr. | 365/174 |
| 5,353,632 A | 10/1994 | Nakagawa | |
| 5,402,410 A | 3/1995 | Yoshimura | 369/275.1 |
| 5,449,901 A | 9/1995 | Fujihira | |

(Continued)

FOREIGN PATENT DOCUMENTS

DE    3823010    9/1989

(Continued)

OTHER PUBLICATIONS

T.R. Albrecht, et al., "Nanometer-scale hole formation on graphite using a scanning tunneling microscope" Appl. Phys. Lett., vol. 55, No. 17, Oct. 23, 1989 pp. 1727-1729.

(Continued)

*Primary Examiner*—Andrea Wellington
*Assistant Examiner*—Kim-Kwok Chu

(57) ABSTRACT

Certain embodiments of the present invention are directed at data storage devices capable of storing, reading and writing data to storage areas of nanometer dimensions. Certain embodiments are directed at devices wherein a fluid medium and particles are provided between a storage medium and an energy-emitting tip to channel energy from the tip to the storage medium. Certain embodiments are directed at devices wherein conductor molecules are attached to the surface of the storage medium and channel energy to the storage medium from an energy-emitting tip. Certain embodiments of the present invention are directed at methods of reading and writing to a storage medium by making use of intermediate particles and/or molecules to channel beams from a tip to a storage medium where data is stored.

27 Claims, 5 Drawing Sheets

U.S. PATENT DOCUMENTS

| | | | | |
|---|---|---|---|---|
| 5,453,970 | A | * | 9/1995 | Rust et al. .................. 369/126 |
| 5,466,935 | A | * | 11/1995 | Ray et al. .................... 250/307 |
| 5,479,024 | A | * | 12/1995 | Hillner et al. ............. 250/458.1 |
| 5,537,372 | A | | 7/1996 | Albrecht et al. .............. 369/43 |
| 5,539,197 | A | * | 7/1996 | Courjon et al. ............. 250/306 |
| 5,557,596 | A | | 9/1996 | Gibson et al. ............... 369/101 |
| 5,581,082 | A | * | 12/1996 | Hansma et al. ............. 250/306 |
| 5,607,568 | A | * | 3/1997 | Zenharusern et al. ....... 204/600 |
| 5,621,210 | A | * | 4/1997 | Lindsay ...................... 250/306 |
| 5,623,295 | A | | 4/1997 | Kishi et al. .................. 347/111 |
| 5,689,494 | A | | 11/1997 | Ichikawa |
| 5,724,336 | A | | 3/1998 | Morton ....................... 369/126 |
| 5,831,153 | A | * | 11/1998 | Binnig et al. ................. 73/105 |
| 5,835,477 | A | | 11/1998 | Binnig et al. ............... 369/126 |
| 5,925,818 | A | * | 7/1999 | Cleveland et al. ............ 73/105 |
| 5,936,243 | A | | 8/1999 | Gibson et al. ............... 250/306 |
| 6,031,756 | A | | 2/2000 | Gimzewski |
| 6,084,848 | A | | 7/2000 | Goto |
| 6,084,849 | A | * | 7/2000 | Durig et al. ................ 369/126 |
| 6,269,067 | B1 | * | 7/2001 | Aratani ....................... 369/126 |
| 6,376,827 | B1 | | 4/2002 | Kasama et al. ............. 250/216 |
| 6,391,217 | B2 | * | 5/2002 | Schaffer et al. ............... 216/41 |
| 6,519,221 | B1 | * | 2/2003 | Manalis et al. ............. 369/126 |
| 6,579,463 | B1 | * | 6/2003 | Winningham et al. ........ 216/41 |
| 6,636,460 | B2 | * | 10/2003 | Akiyama et al. ........ 369/13.14 |

FOREIGN PATENT DOCUMENTS

| WO | WO9834092 | 8/1998 |
|---|---|---|
| WO | WO9908099 | 2/1999 |

OTHER PUBLICATIONS

J. A. Miller, et al., "Scanning tunneling microscopy bit making on highly oriented pyrolytic graphite: Initial results" J. Appl. Phys. vol. 68 (2), Jul. 15, 1990 pp. 905-907.

R. C. Barrett, et al., "Charge storage in a nitride-oxide-silicon medium by scanning capacitance microscopy" J. Appl. Phys. vol. 70 (5), Sep. 1, 1991 pp. 2725-2733.

Sumio Hosaka, et al., "Nanometer-sized phase-change recording using a scanning near-field optical microscope with a laser diode" Jpn. J. Appl. Phys. vol. 35, Part 1, No. 1B, Sep. 13, 1995, pp. 443-447.

E. Betzig, et al., "Fiber laser probe for near-field scanning optical microscopy" Appl. Phys. Lett. 63 (26), Dec. 27, 1993, pp. 3550-3552.

V.P. Jaecklin, et al. "Novel polysilicon comb actuators for xy-stages" Micro Electro Mechanical Systems, Feb. 4-7, 1992, pp. 147-149.

B.G. Yacobi, et al., "Electron-beam-induced information storage in hydrogenated amorphous silicon devices" Appl. Phys. Lett. 44(7), Apr. 1, 1994, pp. 695-697.

E. Huber, et al., "Laser-induced crystallization of amorphous GeTe: A time-resolved study" Physical Review, vol. 36, No. 3, Jul. 15, 1987, pp. 1595-1604.

C. Liu, etal., "High-density nanosecond charge trapping in thin films of the photoconductor ZnODEP" Science, vol. 261, Aug. 13, 1993, pp. 897-899.

A. Sato, et al., "Naometre-scale recording and erasing with the scanning tunnelling microscope" Nature vol. 363 Jun. 3, 1993 pp. 431-432.

H.J. Mamin, et al., "Atomic emission from a gold scanning-tunneling-microscope tip" Physical Review Letters, vol. 65, No. 19, Nov. 5, 1990, pp. 2418-2421.

U. Staufer, et al., "Direct writing of nanometer scale structures on glassy metals by the scanning tunneling microscope" Z. Phys. B—Condensed Matter 77, Jul. 10, 1989, pp. 281-286.

S. Hoen, et al., "Thermomechanical data storage using a fiber optic stylus" Appl. Phys. Lett, vol. 64, No. 3, Jan. 17, 1994 pp. 267-269.

S. Hosaka, etal., "SPM-based data storage for ultrahigh density recording" Nanotechnology 8, Feb. 6, 1997 pp. A58-A62.

S. E. McBride, et al. "Nanometer-scale features produced by electric-field emission" Appl. Phys. Lett., 59 (23), Dec. 2, 1991 pp. 3056-3058.

C.A. Spindt, et al., "Physical properties of thin-film emission cathodes with molybdenum cones" Journal of Applied Physics, vol. 47, No. 12, Dec. 1978, pp. 5248-5263.

Gary W. Jones, et al., "Silicon field emission transistors and diodes" IEEE Transactions on Components, Hybrids, and Manufacturing Technology, vol. 15, No. 6, Dec. 1992, pp. 1051-1055.

Roger T. Howe, et al., "Silicon micromechanics: sensors and actuators on a chip" IEEE Spectrum, Jul. 1990, pp. 29-35.

DK 2000 00188 (Andersen Jen Enevold Thaulov) Aug. 6, 2000.

Patent Abstracts of Japan; vol. 1995, No. 01, Feb. 28, 1995 & JP 06 297252; Oct. 25, 1994.

In Situ Sharpening of Atomic Force Microscope Tips; IBM Technical Disclosure Bulletin, IBM Corp. New York, US vol. 38, No. 2, Feb. 1, 1995.

* cited by examiner

METHODS FOR CONDUCTING CURRENT BETWEEN A SCANNED-PROBE AND STORAGE MEDIUM

RELATED APPLICATION

This application is related to U.S. Patent application to Gary Gibson entitled AFM VERSION OF DIODE- AND CATHODOCONDUCTIVITY- AND CATHODOLUMINESCENCE-BASED DATA STORAGE MEDIA, S/N 20020067634, filed Dec. 1, 2000. That application is incorporated herein in its entire by reference.

FIELD OF THE INVENTION

The present invention relates to a data storage device capable of storing, reading and writing data to data storage areas of nanometer dimensions.

BACKGROUND OF THE INVENTION

Recently, scientists have been developing alternative ultra-high-density data storage devices and techniques useful for operating ultra-high-density data storage devices. These devices and techniques store data bits within storage areas sized on the nanometer scale and possess advantages over conventional data storage devices. Among these advantages are quicker access to the data bits, a lower cost per bit and enablement of the manufacturing of smaller electronic devices.

FIG. 1 illustrates an ultra-high-density data storage device configuration according to the related art that includes a storage medium 40 that is separated into many storage areas (illustrated as squares on the storage medium 40), each capable of storing one data bit. Two types of storage areas, unmodified regions 140 that typically store data bits representing the value "0" and modified regions 130 that typically store data bits representing the value "1", are illustrated in FIG. 1. Typical periodicities between any two storage areas in these devices range between 1 and 100 nanometers.

FIG. 1 also shows, conceptually, emitters 350 positioned above the storage medium 40, and a gap between the emitters 350 and the storage medium 40. The emitters 350 are capable of emitting electron beams and are arranged on a movable emitter array support 360 (also known as a "micromover") that can hold hundreds or even thousands of emitters 350 in a parallel configuration. The emitter array support 360 provides electrical connections to each emitter 350 as illustrated conceptually by the wires on the top surface of emitter array support 360.

The emitter array support 360 can move the emitters 350 with respect to the storage medium 40, thereby allowing each emitter 350 to scan across many storage areas on the storage medium 40. The storage medium 40 can also be placed on a platform that moves the storage medium 40 relative to the emitter array support 360. The platform can be actuated electrostatically, magnetically or by the use of piezoelectrics and, dependent upon the range of motion between the emitter array support 360 relative to the storage medium 40, each emitter 350 can have access to data bits in tens of thousands or even millions of data storage areas.

Related Art: (Ultra-High Density Data Storage Devices)

Some specific embodiments of the ultra-high-density data storage device discussed above are disclosed in U.S. Pat. No. 5,557,596 to Gibson et al. (Gibson '596), the contents of which are incorporated herein in their entirety by reference.

The devices disclosed in the Gibson '596 patent include a storage medium 40 with modified regions 130 and unmodified regions 140, emitters 350 and an emitter array support 360. The Gibson '596 devices provide a relatively inexpensive and convenient method for producing ultra-high-density data storage devices that can be manufactured by well-established and readily-available semiconductor processing technology and techniques. Further, some of the devices disclosed in the Gibson '596 patent are somewhat insensitive to emitter noise and variations in the gap distance between the emitters 350 and the storage medium 40 that may occur when the emitters 350 move relative to the storage medium 40 during device operation. Reasons for these insensitivities are related, for example, to the nature of the diode devices disclosed in the Gibson '596 because the diodes allow constant current sources to be connected to the emitters 350 and allow the electron beam energy to be monitored independently of the signal current in order to normalize the signal as described in the Gibson '596 patent. However, the devices disclosed in the Gibson '596 patent must be operated under stringent vacuum conditions.

The storage medium 40, according to the Gibson '596 patent, can be implemented in several forms. For example, the storage medium 40 can be based on diodes such as p-n junctions or Schottky barriers. Further, the storage medium 40 can include combinations of a photodiode and a fluorescent layer such as zinc oxide. This type of configuration relies on monitoring changes in the cathodoluminescence of the storage medium 40 to detect the state of a written bit. Also, according to the Gibson '596 patent, the storage medium 40 can be held at a different potential than the emitters 350 in order to accelerate or decelerate electrons emanating from the emitters 350.

The emitters 350 disclosed in the Gibson '596 patent are electron-emitting field emitters made by semiconductor micro-fabrication techniques and emit very narrow electron beams. These can be silicon field emitters but can also be Spindt emitters that typically include molybdenum cone emitters, corresponding gates and a pre-selected potential difference applied between each emitter and its corresponding gate. The Gibson '596 patent also discloses electrostatic deflectors that sometimes are used to deflect the electron beams coming from the emitters 350.

According to the Gibson '596 patent, the emitter array support 360 can include a 100×100 emitter 350 array with an emitter 350 pitch of 50 micrometers in both the X- and Y-directions. The emitter array support 360, like the emitters 350, can be manufactured by standard, cost-effective, semiconductor micro-fabrication techniques. Further, since the range of movement of the emitter array support 360 can be as much as 50 micrometers, each emitter 350 can be positioned over any of tens of thousands to hundreds of millions of storage areas. Also, the emitter array support 360 can address all of the emitters 350 simultaneously or can address them in a multiplex manner.

During operation, the emitters 350 are scanned over many storage areas by the emitter array support 360 and, once over a desired storage area, an emitter 350 can be operated to bombard the storage area with either a high-power-density electron beam or a low-power-density electron beam. As the gap between the emitters 350 and the storage medium 40 widens, the spot size of the electron beams also tends to widen. However, the emitters 350 must produce electron beams narrow enough to interact with a single storage area. Therefore, it is sometimes necessary to incorporate electron optics, often requiring more complicated and expensive manufacturing techniques to focus the electron beams.

If the emitters 350 bombard the storage areas with electron beams of sufficient power density, the beams effectively write to the storage medium 40 and change the bombarded storage areas from unmodified areas 140 to modified areas 130. This writing occurs when electrons from the high-power-density-electron beams bombard the storage areas and cause the bombarded storage areas to experience changes of state such as changes from crystalline structures to amorphous structures or from undamaged to thermally damaged.

The changes of state can be caused by the bombarding electrons themselves, specifically when collisions between the electrons and the media atoms rearrange the atoms, but can also be caused by the high-power-density-electron beams transferring the energy of the electrons to the storage areas and causing localized heating. For phase changes between crystalline and amorphous states, if a rapid cooling process follows the heating, an amorphous state is achieved. Conversely, an amorphous state can be rendered crystalline by heating the bombarded storage areas enough to anneal them.

The above writing process is preferable when the storage medium 40 chosen contains storage areas that can change between a crystalline and amorphous structure and where the change causes associated changes in the material's properties. For example, the electrical properties, crystallography, secondary electron emission coefficient (SEEC) and backscattered electron coefficient (BEC) can be altered. According to the devices disclosed in the Gibson '596 patent, these changes in material properties can be detected and allow for read operations to be performed, as will be discussed below.

When a diode is used as the storage medium 40, high-power-density bombarding beams locally alter storage areas on the diode surface between crystalline and amorphous states. The fact that amorphous and crystalline materials have different electronic properties is relied upon to allow the performance of a read operation, as will be discussed further below.

When writing to a storage medium 40 made up of a photodiode and a fluorescent material, the emitters 350 bombard and alter the state of regions of the fluorescent material with the high-power-density-electron beams. This bombardment locally alters the rates of radiative and non-radiative recombination and, thereby, locally alters the light-emitting properties of the bombarded regions of the fluorescent layer and allows yet another approach, to be discussed below, for performing a read operation.

Once data bits have been written to the storage medium 40, a read process can retrieve the stored data. In comparison to the high-power-density-electron beams used in the write process, the read process utilizes lower-power-density-electron beams to bombard the storage regions on the storage medium 40. The lower-power-density-electron beams do not alter the state of the storage areas they bombard but instead either are altered by the storage medium 40 or generate signal currents therein. The amplitudes of these beam alterations or signal currents depend on the states of the storage areas (e.g., crystalline or amorphous) and change sharply dependent on whether the storage areas being bombarded are modified regions 130 or unmodified regions 140.

When performing a read operation on a storage medium 40 that has storage areas that can change between a crystalline and amorphous structure and where the change causes associated changes in the material's properties, the signal current can take the form of a backscattered or secondary electron emission current made up of electrons collected by a detector removed from the storage medium. Since SEEC and BEC coefficients of amorphous and crystalline materials are different, the intensity of the current collected by the detector changes dependent on whether the lower-power-density-electron beam is bombarding a modified region 130 or an unmodified region 140. By monitoring this difference, a determination can be made concerning whether the bombarded storage area corresponds to a "1" or a "0" data bit.

When a diode is chosen as the storage medium 40, the signal current generated is made up of minority carriers that are formed when the lower-power-density electron beam bombards a storage area and excites electron-hole pairs. This type of signal current is specifically made up of those formed minority carriers that are capable of migrating across the interface of the diode and of being measured as a current. Since the number of minority carriers generated and capable of migrating across the diode interface can be strongly influenced by the crystal structure of the material, tracking the relative magnitude of the signal current as the beam bombards different storage areas allows for a determination to be made concerning whether the lower-power-density-electron beam is bombarding a modified region 130 or an unmodified region 140.

In the case of a photodiode and fluorescent material used as the storage medium 40, the lower-power-density electron beam used for reading stimulates photon emission from the fluorescent material. Dependent on whether the region bombarded is a modified region 130 (e.g., thermally modified) or an unmodified region 140, the number of photons stimulated in the fluorescent material and collected by the photodiode will be significantly different. This leads to a different amount of minority carriers generated in the photodiode by the stimulated photons and results in a difference in the magnitude of the signal current traveling across the photodiode interface as the beam bombards different storage areas.

In many of the embodiments described above, a bulk-erase operation is possible to reset all of the modified regions 130 present on the storage medium 40 after the writing process. For example, if an entire semiconductor storage medium 40 is properly heated and cooled, the entire storage medium 40 can be reset to its initial crystalline or amorphous structure, effectively erasing the written data bits. With regard to a photodiode storage medium 40, bulk thermal processing can reset thermally altered areas by processes such as annealing.

Related Art: Atomic Force Microscopes (AFM)

FIG. 2 illustrates a top view of a typical AFM probe 10 according to the related art that is made up of a tip 20, a compliant suspension 30 that supports the tip 20 and that itself is supported by other components of the AFM (not shown) and a piezoelectric material 50 deposited on the top surface of the compliant suspension 30.

The probe 10 can be operated in the contact, non-contact or tapping (intermittent contact) AFM modes that are well known in the art and that will only briefly be discussed here. The contact mode allows for direct contact between the tip 20 and the storage medium 40 while the non-contact mode (not shown) keeps the tip 20 in close proximity (generally on the order of or less than approximately 100 nanometers) to the storage medium 40. The tapping mode allows the compliant suspension 30 to oscillate in a direction perpendicular to the surface of the storage medium 40 while the probe 10 moves in a direction parallel relative to the storage medium 40 and the tip 20 therefore contacts or nearly contacts the storage medium 40 on an intermittent basis and moves between positions that are in direct contact with and in close proximity to the storage medium 40.

The tip 20 is typically, although not exclusively, made from silicon or silicon compounds according to common semiconductor manufacturing techniques. Although the tip 20 is typically used to measure the dimensions of surface features on a substrate such as the storage medium 40 discussed above, the tip 20 can also be used to measure the electrical properties of the storage medium 40.

As stated above, the tip 20 in FIG. 2 is affixed to a compliant suspension 30 that is sufficiently flexible to oscillate as required by the intermittent contact or tapping mode or as required to accommodate unwanted, non-parallel motion of the tip suspension with respect to the storage medium during scanning (so as to keep the tip in contact or at the appropriate working distance). The compliant suspension 30 typically holds the tip 20 at one end and is attached to and supported by the remainder of the AFM or STM structure on the other end. Storage medium 40, in a typical AFM structure, rests on a platform that is moved with relation to the tip 20, allowing the tip 20 to scan across the storage medium 40 as the platform moves.

FIG. 2 illustrates a piezoelectric material 50 deposited on the top surface of the compliant suspension 30. As the tip 20 moves across the storage medium 40, the tip 20 moves the compliant suspension 30 up and down according to the surface variations on the storage medium 40. This movement, in turn, causes either compression or stretching of the piezoelectric material 50 and causes a current to flow therein or causes a detectable voltage change. This voltage or current is monitored by a sensor (not shown) and is processed by other components of the AFM or STM to produce images of the surface topography of the scanned area.

Disadvantages of the Related Technology.

Typical ultra-high-density data storage devices, the devices disclosed by the Gibson '596 patent and the AFM devices described above have several shortcomings for producing high-density data storage devices.

Among the limiting factors of the emitter-based devices disclosed above is the dependency of the spot size of the bombarding beam on the distance separating the emitters 350 and the storage medium 40. This dependency results from the fact that beams emitted by the emitters 350 have a tendency to spread proportionally to the distance that they travel before bombarding the storage medium 40.

Another limitation of the emitter-based devices described above is the vacuum requirement that must be satisfied in order to perform the read and write operations. Without the appropriate vacuum conditions being attained, the beams emitted by the emitters 350 interact with particles present between the storage medium 40 and the emitters 350 and do not reach the storage medium 40 in a sufficiently focused state to perform read and write operations. A poor vacuum can also cause unstable emission and even arcing, which can damage the emitter 350. It can also shorten the emitter 350 or storage medium 40 lifetime via ionization of gas molecules followed by ion bombardment, or via reaction of the emitter 350 or storage medium 40 with gas molecules (particularly ionized ones).

A disadvantage common to all devices described above is emitter damage, in the form of either wear or breakage, that becomes a concern when the emitters 350 contact the storage medium 40. Such contact can occur when the storage medium 40 contains a large topographical feature on the surface thereof that an emitter 350 collides with as the emitter 350 scans across an array of storage areas. Such contact also occurs when an AFM tip 20 is used to read repeatedly from storage medium 40 in contact or intermittent contact modes, thereby wearing the tip 20 and the storage medium 40 over time.

Therefore, what is needed is a method of reading data from and writing data to a storage medium 40 that allows for the focusing of a very small beam spot on the storage medium 40.

What is further needed is a method for energy-beam emitters 350 and tips 20 to be self-forming and/or self-repairing.

What is also needed is a method of reading from and writing to a data storage medium 40 that alleviates or eliminates the necessity for a vacuum environment.

SUMMARY OF THE INVENTION

Certain embodiments of the present invention allow for the effect of variations in the distance between the emitters 350 and the storage medium 40 to be minimized by channeling energy beams from emitters 350 and tips 20 to a storage medium 40.

Certain embodiments of the present invention provide a method for reading data from and writing data to a storage medium 40 that allows for the focusing of a very small beam spot on the storage medium 40 by channeling the beam through conducting particles or molecules.

Certain embodiments of the present invention provide energy-beam emitters 350 and tips 20 that are self-forming and/or self-repairing by using magnetic or dielectric particles to make up part of the emitter 350 or tip 20.

Certain embodiments of the present invention provide a method of reading from and writing to a data storage medium 40 that alleviates or eliminates the necessity for a vacuum environment by providing a conducting path made up of ferrofluid particles (or other materials either discussed below or that will become apparent to one skilled in the art upon practicing the present invention) that are located between a beam-emitter 350 or emitting tip 20 and a storage medium 40. With such a conducting path then the current transport mechanism is different (i.e., not field emission) and there is less need for the high voltages and high fields that normally create the need for a vacuum.

Other aspects and advantages of the present invention will become apparent from the following detailed description, which, when taken in conjunction with the accompanying drawings, illustrates by way of example the principles of the present Invention.

DETAILED DESCRIPTION

Figure 3:
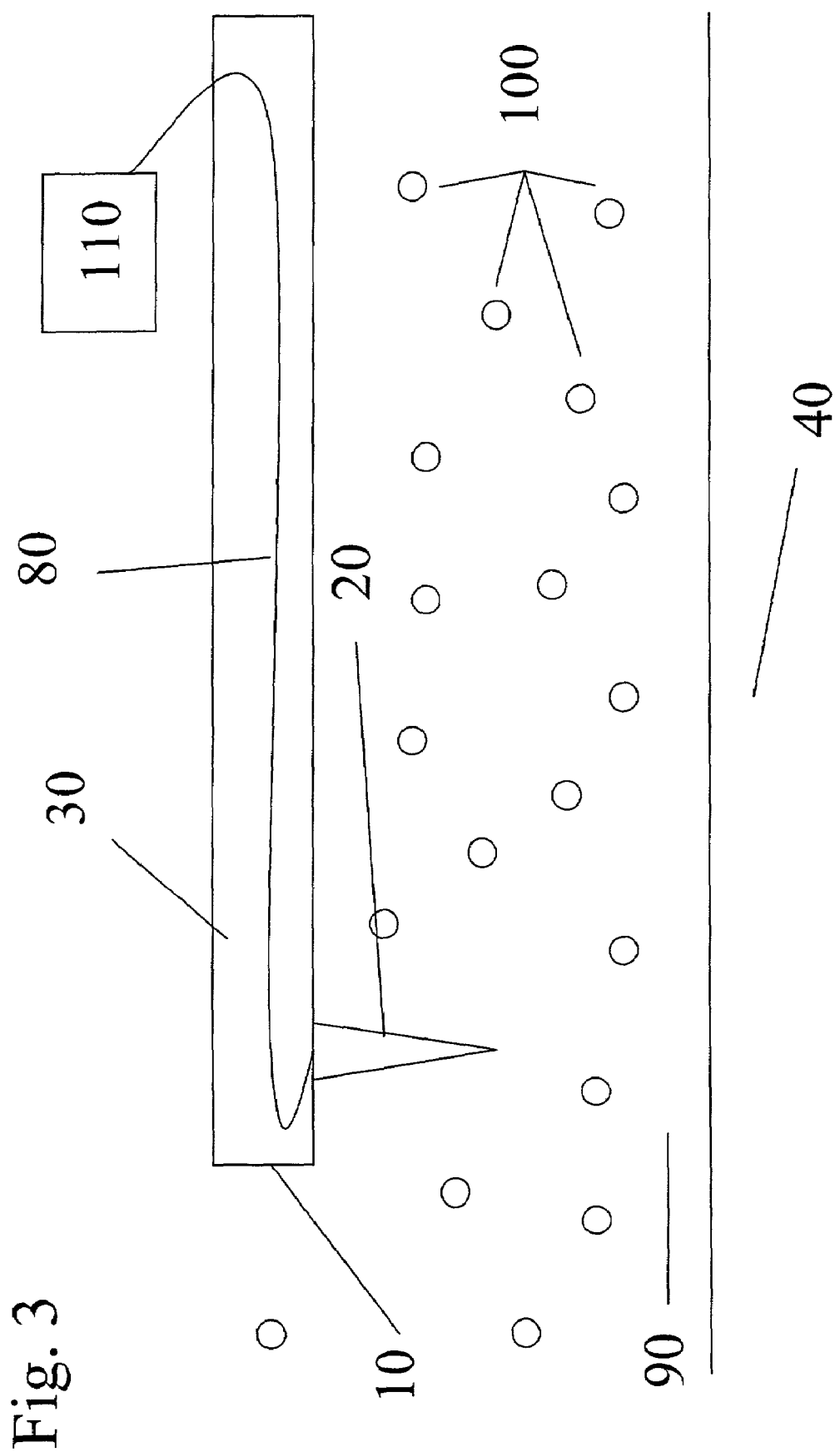
FIG. 3 illustrates a side view of a micro-probe configuration according to certain embodiments of the present invention wherein a fluid medium is present between the storage medium and the conductive probe tip and where the tip is not supplied with power.

Certain embodiments of the present invention are illustrated in FIG. 3, wherein a probe 10, made up of a tip 20, a compliant suspension 30, a power source 110 in the "off" position and a connection 80 connecting the tip 20 to the power source 110 are illustrated. A storage medium 40 is illustrated below the probe 10 and a fluid medium 90, with particles 100 floating therein, is illustrated between the storage medium 40 and the probe 10.

The probe 10 can be analogous to AFM probes such as, but not limited to, those discussed above. Multiple probes 10 can be attached to an emitter array support 360 such as, but not limited to, those discussed above. The emitter array support 360 to which the probes are attached may be moved relative to the storage medium 40 in order to position the probe 10 over a particular storage area or the storage medium 40 may be moved relative to the emitter array support 360.

In addition to the emitter array support 360 embodiments discussed in the Gibson '596 patent, certain embodiments of the present invention include emitter array support 360 configurations that are not attached to a vacuum casing, since certain embodiments of the present invention can be operated at pressures above $10^{-5}$ torr. According to some of these embodiments, the emitter array support 360 is supported instead either by components typically included within AFM configurations or by components that one skilled in the art of the present invention would know to use in order to position the emitter array support 360 at desired locations above the storage medium 40.

The probes 10 on the emitter array support 360 can write to and read from either a single storage area or can scan across up to and including millions of storage areas. Further, the emitter array support 360 configurations, according to certain embodiments of the present invention, can have ranges of motion greater than 50 microns. Even further, the storage medium 40 according to the present invention can include one or more rectifying junctions.

Figure 1:
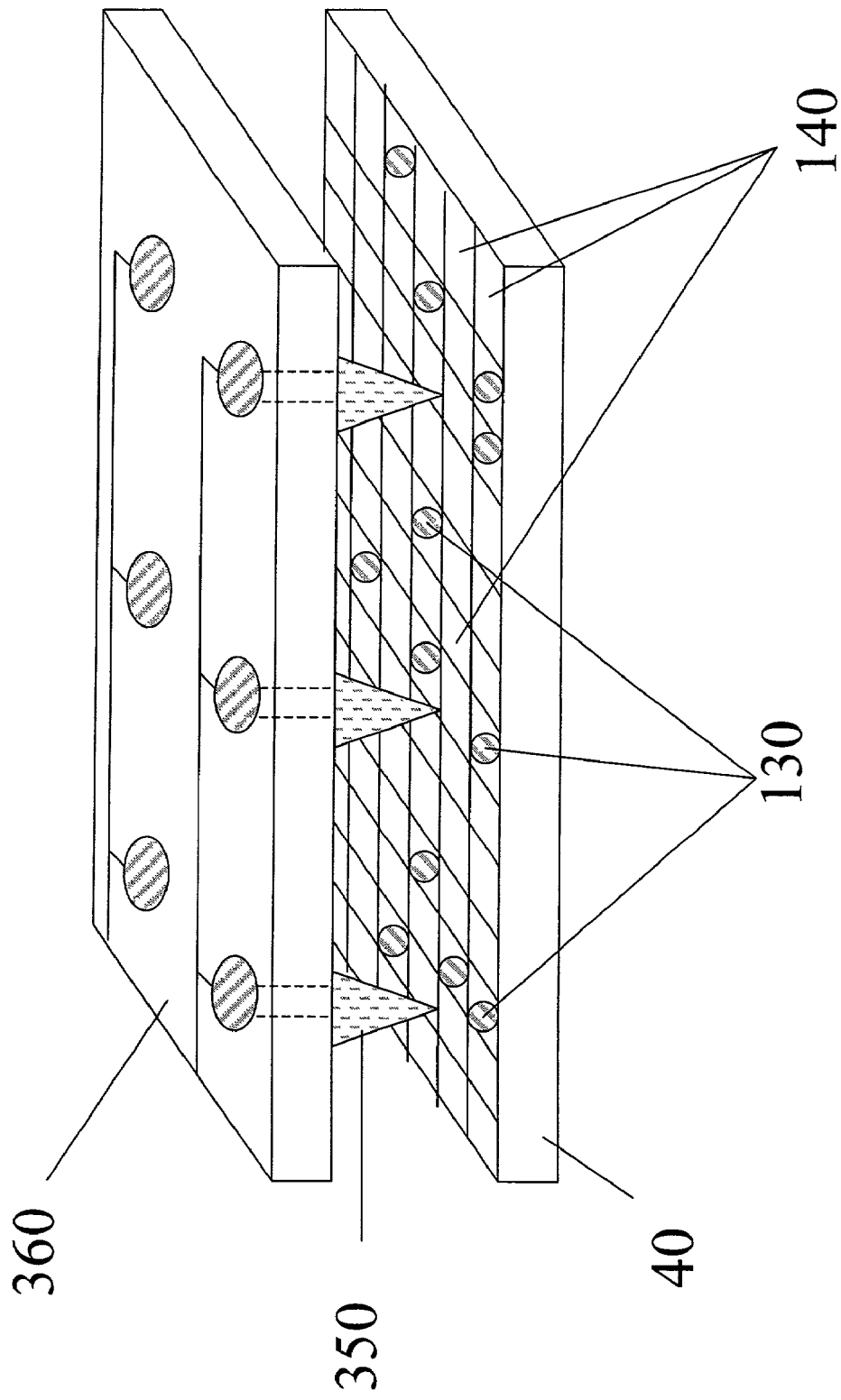
FIG. 1 illustrates an ultra-high-density data storage device according to the related art.
Figure 2:
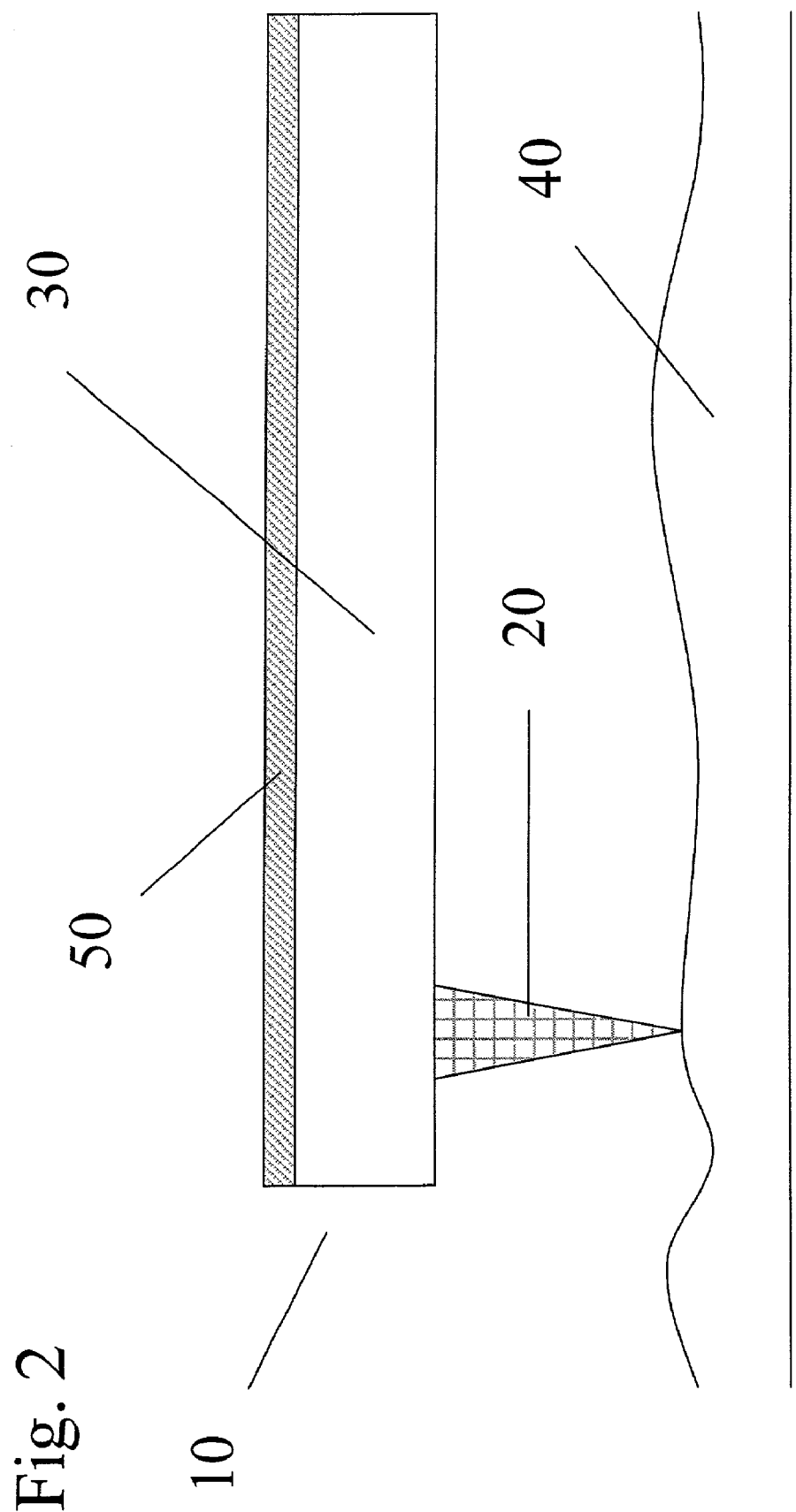
FIG. 2 illustrates a side view of an AFM probe configuration according to the related art.

The energy-emitting probes 10 supported by the emitter array support 360 can, according to certain embodiments of the present invention, be addressed simultaneously or in a multiplexed manner and the wiring to the probes is not restricted to the single wire illustrated in FIG. 1. Either one or a multitude of wires can be used, depending on the embodiment.

The tip 20 can be implemented with any element of a probe for altering a state of an area of the storage medium 40 for use in writing and reading data. For example, the tip 20 can be implemented as the emitter 350 described above. The tip 20 of the probe 10 can be positioned at distances from the storage medium 40 that are typical for AFM tips in either non-contact or tapping AFM modes. The tip 20 does not require a gate electrode to deliver a current. In fact, according to certain embodiments, a simple conical tip is enough. The probe 10 and the tip 20 can generally be formed by standard manufacturing techniques and can be made of silicon or silicon alloys, although other types of conductive materials can also be used to make the tip 20 or emitter 350. According to certain embodiments of the present invention, in addition to the emitters 350 discussed above, emitters 350 such as, but not limited to, flat cathode emitters can also be used to produce the energy beams needed to read from and write to the storage medium 40.

The tip 20 or emitter 350 typically emits an electron beam but can also emit a thermal beam, a light beam or any other type of energy beam, depending on the embodiment of the present invention. The tip 20 or emitter 350, according to certain embodiments of the present invention, must be able to withstand power emissions and associated temperatures while creating bombarding beams that are capable of altering the state of the storage medium 40 while performing write operations. This is also true of the fluid medium 90 and particles 100 that are included in certain embodiments of the present invention. In addition to the tip 20 illustrated in FIG. 3 and the emitters 350 illustrated in FIG. 1, other components capable of channeling electrons or other energy forms with sufficient power density to write to the storage medium 40 are also within the scope of certain embodiments of the present invention.

In addition to the geometry of tip 20 illustrated in FIGS. 1–5, certain embodiments of the present invention can incorporate other component or tip geometries, some examples of which are disclosed in U.S. Pat. No. 5,936,243 to Gibson et al. (Gibson '243), the contents of which are herein incorporated in their entirety by reference The components or tips used in the embodiments of the present invention can have any geometry that one skilled in the art would know to use in practicing the present invention, and generally should be formed from materials capable of withstanding the temperature conditions experienced when channeling the high-power-density beams discussed above.

The compliant suspension 30, can be made of many types of materials. Flexible materials and those materials conducive to being manufactured by standard semiconductor processing techniques are generally preferred. The compliant suspension 30 has the tip 20 or emitter 350 attached thereto and is itself attached to a device analogous to the emitter array support 360 discussed above.

The power source 110 allows the tip 20 to provide a localized source of energy and can, according to certain embodiments, emit a high-power-density beam capable of altering the state of the region of the storage medium 40 being bombarded by the emitted beam. In certain embodiments, the tip 20 can be in direct contact with the storage medium 40 or can be separated from the storage medium 40 by distances typical for AFM configurations in either the non-contact or intermittent contact modes.

The power source 110 can be any power-generating device capable of producing and supplying sufficient power to the tip 20 or emitter 350 to allow emission of an energy beam capable of altering the state of a storage area in the storage medium 40. The power source 110 is connected to the tip 20 or emitter 350 via a connection 80 that, according to certain embodiments of the present invention, can be made up of a wire capable of transmitting the power from the power source 110 to the tip 20 or emitter 350 without melting. The connection 80 can be made up of electrically conductive materials such as, but not limited to, aluminum, copper, gold, silver or any alloys thereof. The connection 80 can also be made up of materials facilitating the transfer of heat, light or other energy from the power source 110 to the tip 20 or emitter 350.

The storage medium 40 can be a material or device such as, but not limited to, the devices disclosed in the Gibson '596 patent, $p^+$–p junctions, $n^+$–n junctions or rectifying junctions that allow for reading and writing operations such as the operations discussed above to be performed. The storage medium 40 contains nanometer-scaled storage areas that can be changed from unmodified regions 140 to modified regions 130 by a reading or writing operation. Further, according to certain embodiments, semiconducting chalcogenide reversible phase-change materials may also be used as part of the storage medium 40. According to certain other embodiments of the present invention, direct bandgap III-VI chalcogenide-based phase change materials are preferably used.

Also, the storage medium 40, according to certain embodiments, can be a material capable of holding a localized charge. With such a material, the tip 20 or emitter 350 can be positioned over a designated storage area and perform a writing operation by bombarding the storage area with an electron beam to create a localized charge in the storage medium 40. A subsequent reading operation on this type of material involves positioning the tip 20 or emitter over a designated storage area and detecting whether the storage area had previously been charged.

According to certain embodiments of the present invention, any of the above-discussed probes or any other probe within the scope of certain embodiments of the present invention may be used to write and read to any of the embodiments of the storage medium 40.

According to certain embodiments of the present invention, in addition to the emitters 350 discussed above, emitters 350 such as, but not limited to, flat cathode emitters can also be used to produce the energy beams needed to read from and write to the storage medium 40.

Although the data bits discussed above and included in the storage medium 40 are binary in the sense that they can be, for example, in either an amorphous or crystalline state or either thermally modified or unmodified, certain embodiments of the present invention include a storage medium 40 with non-binary data bits where, for example, the state of the data bits can be chosen to be either amorphous or one of several crystalline states.

Between the storage medium 40 and the probe 10 is a fluid medium 90. According to certain embodiments of the present invention, fluid medium 90 is a high-dielectric fluid capable of withstanding high temperatures such as those present when the tip 20 or emitter 350 emits an energy beam capable of altering the state of a storage areas. The fluid medium 90 can include, but is not limited to, silicon and hydrocarbon oils, chlorinated hydrocarbons and water.

The fluid medium 90 can also be implemented with a fluid capable of suspending the particles 100 illustrated in FIG. 3 above the storage medium 40. The fluid medium 90 can be a ferrofluid or can contain particles 100 that are of a metallic nature or otherwise affected by the presence of an electron beam and the magnetic or electric field associated therewith. These fields form between the tip 20 and the storage medium 40 and cause the particles 100 to agglomerate and form a conducting path. If a ferrofluid is used, the tip 20 or emitter 350 is preferably made of a ferro- or paramagnetic material capable of influencing the particles 100. The fluid medium 90 present between the storage medium 40 and the tip 20 or emitter 350 eliminates the need for a vacuum to be formed, although a vacuum can still be used if desired.

The fluid medium 90 can completely immerse the probe 10 or only immerse the tip 20 or emitter 350. Alternatively, the surface of the fluid medium 90 is below the tip 20 or emitter 350 while the tip 20 or emitter is not emitting an energy beam. In that embodiment, once the tip 20 or emitter 350 starts emitting a beam, the particles 100 in the fluid medium 90 get attracted to the tip 20 or emitter 350 and "pull" the surface of the fluid medium 90 up, thereby effectively forming a "bridge" between the tip 20 or emitter 350 and the fluid medium 90.

The thickness of the fluid medium is typically on the order of several hundred nanometers or less. However, greater thicknesses are also within the scope of the present invention and, according to certain embodiments, the fluid medium 90 need not be present whatsoever.

The particles 100 are typically chosen to be magnetic, metallic or semiconducting particles, typically having a lower diameter size limit of approximately 10 nm and an upper diameter size limit on the order of the thickness of the fluid medium 90. The particles 100 can be made from materials such as, but not restricted to, ferrite particles such as magnetite. However, particles 100 chosen such that they are either electrically conductive and/or polarizable are within the scope of the present invention.

Figure 4:
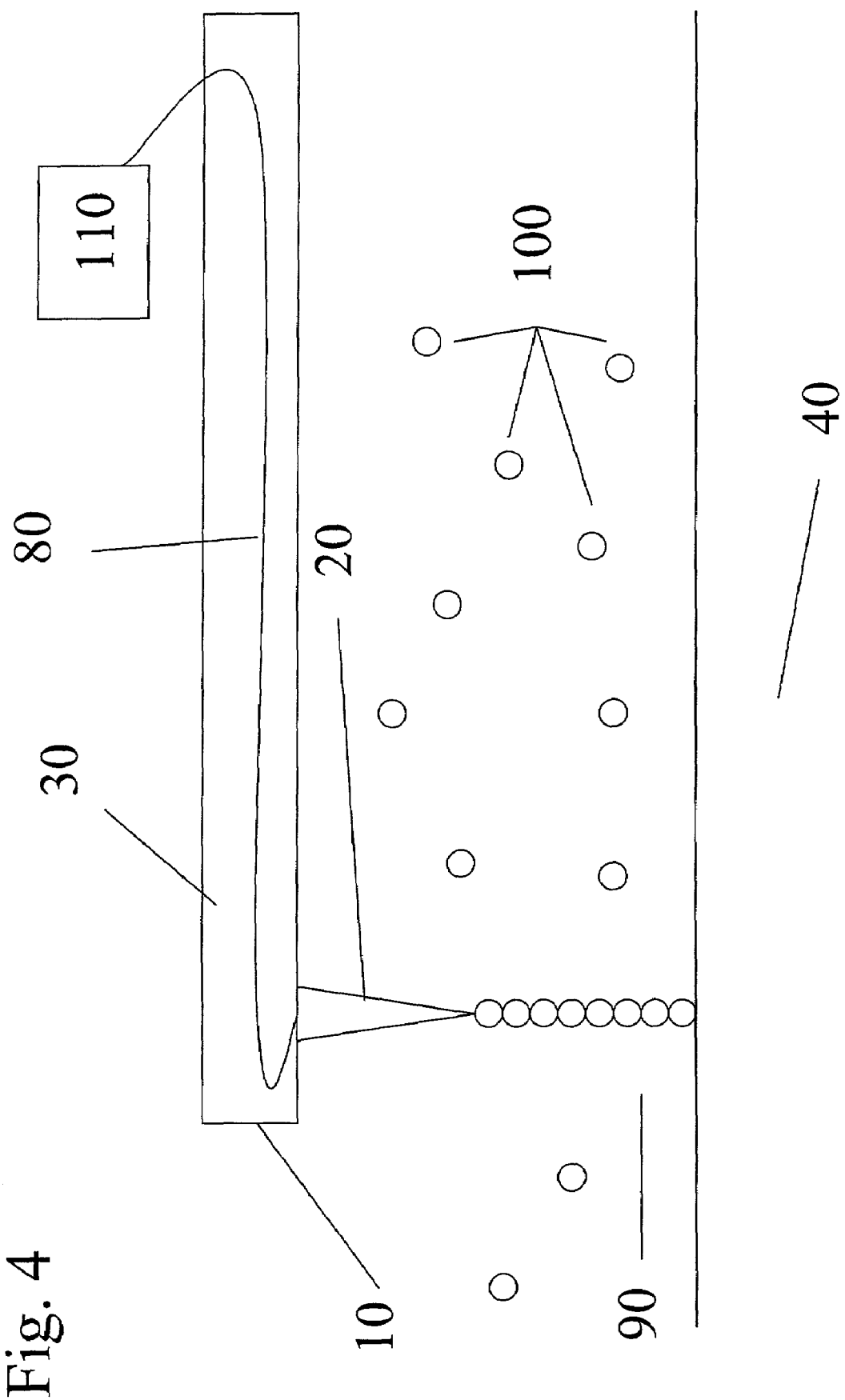
FIG. 4 illustrates a side view of a micro-probe configuration according to certain embodiments of the present invention wherein a fluid medium is present between the storage medium and the conductive probe tip and where the tip is supplied with power.

FIG. 4 illustrates embodiments of the present invention wherein the power source 110 is in the "on" position. Although FIG. 3 shows the particles 100 dispersed throughout the fluid medium 90, the particles 100 disclosed in FIG. 4 align themselves between the tip 20 and the storage medium to form a wire-like column. The alignment of the particles 100 results from the presence of an energy beam, and the electric and magnetic fields associated therewith, and occurs as the particles 100 move to positions along the energy beam flux lines.

Although the particle column between the tip 20 and storage medium 40 illustrated in FIG. 4 appears to be only one particle 100 thick, thicker columns are also within the scope of the present invention. Also, although the particles 100 making up the column appear to be fixed between the storage medium 40 and the tip 20, some of the particles 100 move away from the column and get replaced by other particles 100 over time. Further, the column length is dependent upon many factors, including, but not limited to, the strength of the electric or magnetic fields applied between the tip 20 and storage medium 40, the viscosity of the fluid medium 90 and the size, conductivity, polarizability and/or permeability of the particles.

When the power source 110 is in the "on" position, the tip 20 or emitter 350 applies an electric or magnetic field between itself and the storage medium 40 and produces the configuration of the particles 100 illustrated in FIG. 4. Once an electric (magnetic) field is generated, it attracts the dielectric/paraelectric (magnetic/paramagnetic) particles 100 along its lines of flux. To generate an electric field, an electrical potential can be applied between the tip 20 and storage medium 40. To generate a magnetic field, a paramagnetic tip can be used, for example, as a magnetic flux concentrator. Alternatively, if a magnetic field and electrically-conducting magnetic particles are used, the tip 20 can be a permanently magnetized ferromagnet. In this case, a bridge of particles would form continually between the tip 20 and storage medium 40. This bridge could be dragged across the storage medium 40 as the tip 20 is moved relative to the storage medium 40. When needed, an electric current of appropriate magnitude for reading or writing data could be driven through the bridge of particles by applying an appropriate electrical potential between the tip 20 and storage medium 40.

According to certain embodiments of the present invention, the particles 100 are magnetic and very small and the tip 20 or emitter 350 and storage medium 40 are magnetic. In these embodiments, the particles 100 tend to collect between the tip 20 or emitter 350 and the storage medium 40 and a magnetic (preferably paramagnetic) layer is provided under the actual data storage layer of the storage medium 40 as a flux return path.

Alternatively, according to certain other embodiments, dielectric particles are used in conjunction with electric fields and a conducting layer is placed under the storage layer of the storage medium 40 in order to provide an "image charge." Of course, depending on the type of storage medium 40 used, the storage medium 40 itself may be conductive enough without a separate conducting layer. Generally, the collections of particles 100 discussed above act as conductive paths and can be "pulled" along the surface of the storage medium 40, thereby effectively forming an extended tip 20.

In the context above, "magnetic" refers to various combinations of ferro-, para- and dia-magnetic for the tip 20, particles 100 and storage medium 40. Alternatively, an electrofluid that contains electrically polarizable particles could be used. In this case, the electric field between the tip 20 and the storage medium 40, which no longer needs to be magnetic, would attract the particles.

To control or tune the attraction between particles 100 due to dipole-dipole or Van der Walls forces and to minimize unwanted agglomeration, each particle 100 may need to be coated by long-chain molecules or by an electrostatic layer.

Once the particles 100 are aligned as illustrated in FIG. 4, the electron beam emitted from the tip 20 or emitter 350 is effectively channeled by the wire-like arrangement of the particles 100 since electrons will be diverted away from a high-dielectric fluid medium 90 and to the particle 100 path presented. This allows for the beam emitted by the tip 20 or emitter 350 to remain within a confined spot-size within the diameter of the wire-like arrangement of the particles 100.

Figure 5:
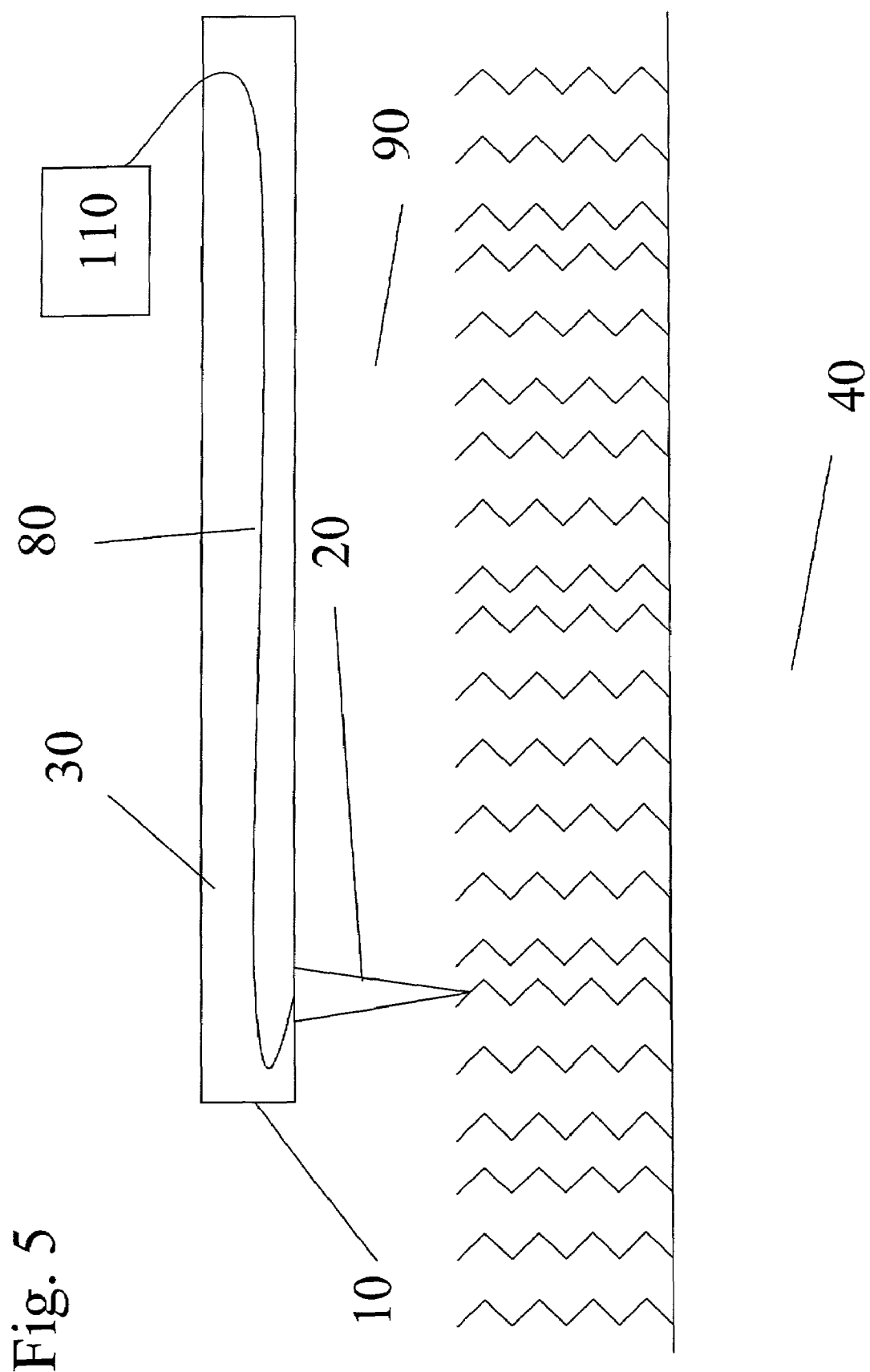
FIG. 5 illustrates a side view of a micro-probe configuration according to certain embodiments of the present invention wherein an intermediate layer including one-dimensional conductor molecules is present between the storage medium and the conductive probe tip.

FIG. 5 illustrates embodiments of the present invention wherein the fluid medium 90 and the particles 100 illustrated in FIGS. 3 and 4 are replaced by conductor molecules 120. In certain embodiments of the present invention, the conductor molecules 120 are one-dimensional and are immersed, at least partially, in a fluid medium 90.

The conductor molecules 120 illustrated are attached at one of their ends to the storage medium 40 and are unattached at their other ends. In order to promote attachment, the surface of storage medium 40, and/or the "attaching" end of the conductor molecules, may be chemically treated (functionalized) or physically modified by standard techniques such as etching. The conductor molecules 120 may be attached via ionic bonding, covalent bonding, Van der Wall forces or any other method that will fix the position of one end of a conductor molecule 120 to the storage medium 40.

The conductor molecules 120 can be made from materials such as, but not limited to, diols, surfactants, nanotubes, organic polymers and inorganic polymers so long as the conductor molecules 120 allow for one-dimensional conductivity. Typical lengths for the conductor molecules 120 are in the range of several hundred nanometers and therefore can stretch between the tip 20 or emitter 350 and the storage medium 40. No limiting conductor molecule 120 length exists for, in many situations, the presence of conductor molecules 120 of any length will aid in reducing beam spot size on the storage medium 40.

The particles 100 illustrated in FIGS. 3 and 4 can be chosen to have high melting temperatures. The conductor molecules 120, on the other hand, are often chosen to be organic molecules and therefore have maximum operating temperatures at which they can withstand processes as calcinations that eliminate their presence. Therefore, according to certain embodiments of the present invention, the storage areas are not bombarded with sufficient energy to cause a change of state but are instead charged by an electron beam emitted by the tip 20 or emitter 350 as discussed above.

In summary, certain embodiments of the present invention allow for particles 100 in a fluid medium 90 to align themselves along electron beam flux lines or along magnetic beams to direct the beams along a relatively focused, and occasionally collimated, route, leading to smaller beam spot sizes bombarding the storage medium 40. The particles 100 can even adhere to the tip 20 to generate a new type of tip or re-generate tip 20 so long as the power source is on. The fluid medium 90 eliminates the need for a vacuum requirement and the particles contained within it can also channel light, heat or other energy beams under specified conditions (i.e., if the particles are aligned by an electric field and simultaneously conducting thermal energy to the storage medium 40).

According to another embodiment of the present invention, the particles 100 and, optionally, the fluid medium 90 are replaced by conductor molecules 120 that are attached to the storage medium 40 and channel the energy beams to the storage medium. Although these conductor molecules can be organic, ways of writing to the storage areas of the storage medium 40 are available such as locally charging the storage areas.

Although the above embodiments are representative of portions of the present invention, other embodiments of the present invention will be apparent to those skilled in the art from a consideration of this specification or practice of the present invention disclosed herein. It is intended that the specification and examples be considered as exemplary only, with the present invention being defined by the claims and their equivalents.

What is claimed is:

1. A data storage device, comprising:
   a storage medium;
   nanometer-scaled data storage areas in the storage medium;
   an energy-emitting tip positioned in close proximity to the storage medium;
   a fluid medium positioned between the energy-emitting tip and the storage medium wherein the fluid medium comprises a ferrofluid; and
   particles contained in the fluid medium.

2. The data storage device of claim 1, wherein the energy-emitting tip emits electrons.

3. The data storage device of claim 1, wherein the energy-emitting tip emits thermal energy.

4. The data storage device of claim 1, wherein the fluid medium comprises a high-dielectric fluid.

5. The data storage device of claim 1, wherein the particles comprise a material chosen from the group consisting of electrically conducting, dielectric and paraelectric materials.

6. The data storage device of claim 1, wherein the particles comprise a magnetic material.

7. The data storage device of claim 1, wherein the particles form a bridge between the tip and the storage medium.

8. A data storage device, comprising:
   a storage medium;
   nanometer-scaled data storage areas in the storage medium;
   an energy-emitting tip positioned in close proximity to the storage medium wherein the energy-emitting tip emits electrons; and molecules positioned between the energy-emitting tip and the storage medium wherein the molecules are at least partially immersed in a fluid medium.

9. The data storage device of claim 8, wherein the energy-emitting tip emits thermal energy.

10. The data storage device of claim 8, wherein each of the molecules comprises a one-dimensional conductor molecule.

11. The data storage device of claim 10, wherein the one-dimensional conductor molecule comprises at least one type of molecule chosen from the group consisting of diols, polymers, surfactant, nanotubes and polymers.

12. The data storage device of claim 8, wherein the molecules compnse conductive molecules attached to the storage medium.

13. A method of data storage comprising:
providing a storage medium comprising nanometer-scaled data storage areas;
positioning an energy-emitting tip in close proximity to the storage medium;
guiding energy emitted from the energy-emitting tip to the storage area wherein the guiding step comprises channeling the energy emitted through particle in a fluid medium between the storage medium and the energy-emitting tip wherein the fluid medium comprises a ferrofluid; and
altering a state of the storage areas with the emitted, guided energy.

14. The method of claim 13, wherein the guiding step comprises channeling the energy emitted through conductor molecules positioned between the storage medium and energy-emitting tip.

15. The method of claim 14, wherein the guiding step comprises using conductor molecules wherein each of the conductor molecules comprises one-dimensional conductor molecules.

16. The method of claim 13, wherein the guiding step comprises using particles that form a bridge between the storage medium and the energy emitting tip.

17. A data storage device comprising:
a storage medium;
nanometer-scaled data storage areas in the storage medium;
an energy-emitting tip positioned in close proximity to the storage medium; and
particles contained in the fluid medium, wherein the partides comprise a magnetic material.

18. A method of data storage comprising:
providing a storage medium comprising nanometer-scaled data storage areas;
positioning an energy-emitting tip in close proximity to the storage medium;
guiding energy emitted from the energy-emitting tip to the storage area wherein guiding comprises channeling the energy emitted through particle in a fluid medium between the storage medium and the energy-emitting tip wherein the fluid medium comprises a ferrofluid; and
altering a state of the storage areas with the emitted, guided energy.

19. A data storage device comprising:
a data storage medium having a material property that is capable of changing a memory state under the influence of a directed beam of energy;
nanometer-scaled data storage areas in the storage medium;
at least one tip in close proximity to the storage medium, the tip configured to emit a directed high-power-density beam towards the data storage medium when the tip is in an energy emitting state;
a fluid medium positioned between the tip and the storage medium; and
dispersed particles of metallic material within the fluid medium, the dispersed particles having sufficient tolerances permitting alignment between the tip and storage medium along the directed high-power-density beam when the tip is in the energy emitting state to form a temporary wire-like column, the wire-like column facilitating the transfer of applied energy to change the memory state in a manner complementary to the material property.

20. The data storage device of claim 19, wherein the wire-like column serves as a temporary conductor between the tip and the storage medium.

21. The data storage device of claim 19, wherein the metallic material particles are magnetic material particles.

22. The data storage device of claim 19, wherein the conductive particles do not adhere to the storage medium.

23. The data storage device of claim 19, wherein the high-power-density beam emitted is an electron beam.

24. The data storage device of claim 19, wherein the fluid medium is substantially dielectric in a relaxed state and locally conductive in an excited state, the aligned magnetic particles in along the directed high-power-density beam establishing the excited state.

25. A method of data storage comprising:
providing a storage medium comprising nanometer-scaled data storage areas;
providing a fluid medium upon the storage medium, the fluid medium including dispersed particles of metallic material;
positioning a tip in close proximity to the storage medium and the fluid medium, the tip configured to emit a directed high-power-density beam towards the data storage medium when the tip is in an energy emitting state;
generating a directed high-power-density beam from the tip towards the storage medium through the fluid medium, the dispersed metallic particles aligning between the tip and the storage medium along the directed high-power-density beam to form a wire-like column, the wire-like column facilitating the transfer of applied energy to a targeted storage area of the storage medium; and
altering a state of the targeted storage area with the directed high-power-density beam.

26. The method of claim 25, wherein the conductive particles re-disperse in the fluid medium upon removal of the high-power-density beam.

27. The method of claim 25, wherein the fluid medium is a ferrofluid.

* * * * *

UNITED STATES PATENT AND TRADEMARK OFFICE
CERTIFICATE OF CORRECTION

PATENT NO. : 7,170,842 B2
APPLICATION NO. : 09/783008
DATED : January 30, 2007
INVENTOR(S) : Gary A. Gibson It is certified that error appears in the above-identified patent and that said Letters Patent is hereby corrected as shown below:

In column 1, line 12, delete "entire" and insert -- entirety --, therefor.

In column 12, line 35, in Claim 1, after "device" delete ",".

In column 13, line 12, in Claim 11, delete "surfactant" and insert -- surfactants --, therefor.

In column 13, line 14, in Claim 12, delete "compnse" and insert -- comprise --, therefor.

In column 13, line 18, in Claim 13, delete "areas;" and insert -- area; --, therefor.

In column 13, line 26, in Claim 13, after "ferrofluid;" delete "and".

In column 13, line 32, in Claim 14, insert -- the -- before "energy-emitting".

In column 13, line 45, in Claim 17, after "medium;" insert -- a fluid medium positioned between the energy-emitting tip and the storage medium; --.

In column 13, line 47, in Claim 17, delete "partides" and insert -- particles --, therefor.

In column 13, line 50, in Claim 18, delete "areas;" and insert -- area; --, therefor.

In column 13, line 54, in Claim 18, after "area" insert -- , --.

In column 13, line 55, in Claim 18, delete "particle" and insert -- particles --, therefor.

In column 13, line 57, in Claim 18, after "tip" insert -- , and --.

UNITED STATES PATENT AND TRADEMARK OFFICE
CERTIFICATE OF CORRECTION

PATENT NO. : 7,170,842 B2
APPLICATION NO. : 09/783008
DATED : January 30, 2007
INVENTOR(S) : Gary A. Gibson It is certified that error appears in the above-identified patent and that said Letters Patent is hereby corrected as shown below:

In column 13, line 57, in Claim 18, delete "ferrofluid;" and insert -- ferrofluid, --, therefor.

Signed and Sealed this

Twenty-second Day of September, 2009

David J. Kappos
*Director of the United States Patent and Trademark Office*